United States Patent
Ezzeddine

(10) Patent No.: US 7,330,085 B2
(45) Date of Patent: Feb. 12, 2008

(54) BALUN WITH LOCALIZED COMPONENTS

(75) Inventor: Hilal Ezzeddine, Tours (FR)

(73) Assignee: STMicroelectronics S.A., Montrouge (FR)

( * ) Notice: Subject to any disclaimer, the term of this patent is extended or adjusted under 35 U.S.C. 154(b) by 182 days.

(21) Appl. No.: 11/283,178

(22) Filed: Nov. 18, 2005

(65) Prior Publication Data

US 2006/0103484 A1    May 18, 2006

(30) Foreign Application Priority Data

Nov. 18, 2004    (FR) ................................. 04 52678

(51) Int. Cl.
*H03H 7/42*    (2006.01)
*H03H 7/00*    (2006.01)

(52) U.S. Cl. .......................................... 333/26; 333/25
(58) Field of Classification Search .................. 333/25, 333/26
See application file for complete search history.

(56) References Cited

U.S. PATENT DOCUMENTS

| | | | |
|---|---|---|---|
| 4,864,644 A | 9/1989 | Takahashi et al. | |
| 5,023,576 A | 6/1991 | Staudinger et al. | |
| 5,148,130 A | 9/1992 | Dietrich | |
| 5,949,299 A * | 9/1999 | Harada | 333/25 |
| 6,052,039 A * | 4/2000 | Chiou et al. | 333/100 |
| 6,952,142 B2 | 10/2005 | Guitton et al. | |
| 7,005,956 B2 * | 2/2006 | Wang | 336/200 |
| 2003/0137383 A1 | 7/2003 | Yang et al. | |
| 2003/0210122 A1 | 11/2003 | Concord et al. | |

OTHER PUBLICATIONS

French Search Report from French Patent Application 04/52678, filed Nov. 18, 2004.

* cited by examiner

*Primary Examiner*—Dean Takaoka
(74) *Attorney, Agent, or Firm*—Lisa K. Jorgenson; James H. Morris; Wolf, Greenfield & Sacks, P.C.

(57) ABSTRACT

A mode-switching transformer with localized components comprising: between a first common-mode access terminal and a first differential-mode access terminal defining a first path, two LC cells, each formed of an inductance interposed on the first path and of a capacitor connecting one end of this inductance to ground; and between said first common-mode access terminal and a second differential-mode access terminal defining a second path, two LC cells, each formed of a capacitor interposed on the second path and of an inductance connecting one of the electrodes of this capacitor to ground, the respective inductances of the two cells of each path being made in the form of inductances with a midpoint having respective coupled portions of a same path formed in several superposed metallization levels.

6 Claims, 3 Drawing Sheets

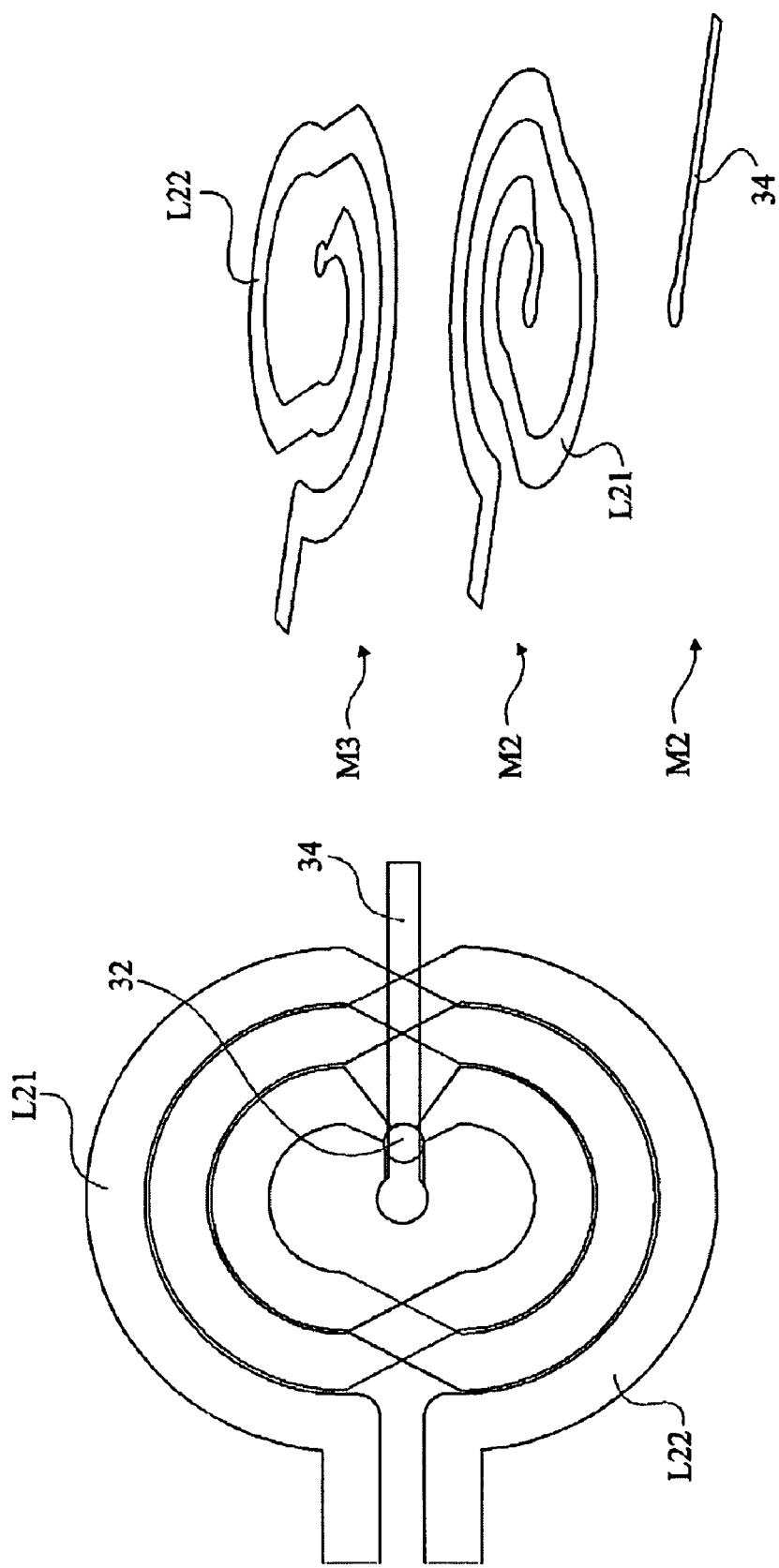

BALUN WITH LOCALIZED COMPONENTS

BACKGROUND OF THE INVENTION

1. Field of the Invention

The present invention relates to the field of mode-switching transformers which are used to convert a common mode voltage to a differential mode and conversely. Such transformers are generally called "balun" transformers, for "balanced-unbalanced" transformers. It is also spoken of a transformer between a differential mode and a non-differential mode.

An example of application of a mode-switching transformer relates to radio-frequency transceiver channels, for example, of a mobile phone. This type of application currently uses balun-type device since, on the antenna side, it most often is a single-ended device.

Two categories of mode-switching transformers are essentially known, that is, coupled-line baluns, said to be distributed, and baluns with localized components. Coupled-line baluns are formed of conductive tracks coupled to each other, the operating frequency of the transformer being conditioned by the line length. Baluns with localized components are formed of capacitive and inductive elements forming LC cells.

The present invention relates to baluns with localized components which are generally intended for low-band applications, that is, for which the correct operating frequency band of the transformer is at most on the order of 100 MHz.

2. Discussion of the Related Art

FIG. 1 shows the electric diagram of a conventional balun with localized components. Such a transformer is essentially formed of a first LC cell 1 connecting a common-mode access or terminal 3 to a first differential-mode terminal or access 4, and of a second LC cell 2 connecting common-mode terminal 3 to a second differential-mode terminal 5. Terminal 3 is intended, for example, to receive a common-mode signal Vcm originating from a connection to an antenna. This signal is referenced to ground M of the equipment comprising the mode-switching transformer. The signal is shared between the differential input-output 4 and 5 which provide signals ideally phase-shifted by 180° with respect to each other. Terminal 4 can then arbitrarily be defined as being positive with respect to ground M (voltage Vpd) and terminal 5 can be defined as being the negative terminal (voltage Vnd). The ground on the differential-mode side is generally the same as the ground of common-mode voltage Vcm. However, such grounds may be different from each other, especially in case of a galvanic insulation.

In the shown example, first cell 1 is formed of an inductance L1 connecting terminal 3 to terminal 4 and of a capacitor C1 connecting terminal 4 to ground. Second cell 2 is inverted with respect to the first one and is thus formed of a capacitor C2 connecting terminal 3 to terminal 5 and of an inductance L2 connecting terminal 5 to ground. Cell 1 in fact corresponds to a low-pass filtering cell while cell 2 corresponds to a high-pass filtering cell. High-pass and low-pass filters 2 and 1 are sized to have a same cut-off frequency which corresponds to the central frequency of the transformer's operating band.

The balun structure illustrated in FIG. 1 can be completed with circuits for setting a D.C. component on the differential side. Said component is then provided by two separate voltage sources connected by respective inductances, not shown (snubbers), to terminals 4 and 5. The function of these inductances is to serve as a line trap to avoid for the dynamic signal crossing the transformer to reach the power supplies. Additional capacitors are then generally placed between each of terminals 4 and 5 and inductance L1, respectively capacitor C2. The capacitors prevent the D.C. component set on the differential mode side from reaching common-mode terminal 3.

A mode-switching transformer essentially characterizes by four parameters measured by loading the different accesses with standardized 50-ohm impedances.

A first parameter relates to differential insertion losses corresponding to the path loss between the common-mode terminal and the two differential terminals. This parameter is generally considered as good if the losses are below 1 dB.

A second parameter is the amplitude difference from one path to the other (amplitude imbalance), which corresponds to the difference between insertion losses from one path to the other. In an ideal transformer, that is, perfectly well balanced and with no insertion loss, the signal divides in two for the two differential ports and −3 dB are thus obtained on each path with respect to the common-mode signal. The amplitude imbalance then is zero. The amplitude imbalance parameter is considered as good if it ranges between −0.5 dB and 0.5 dB. This amplitude imbalance parameter is particularly important since the signal is generally exploited on the differential-mode side by difference between the signals, to cancel possible disturbances.

A third parameter is the phase difference (phase imbalance), which measures the interval between the phase difference of two differential accesses with respect to the 180 degrees desired in the ideal case. The phase imbalance is considered as good if it ranges between −5° and 5°.

A fourth parameter is the matching or return loss which corresponds to the impedance matching on the common-mode and differential-mode accesses. This last parameter is evaluated according to the circuits connected at each end of the transformer and is considered as acceptable if it is smaller than −15 dB.

All the above parameters are evaluated for different signal frequencies and are in fact given for an operating frequency range of the transformer around a central frequency.

A disadvantage of conventional mode-switching transformers with localized components is that they generally exhibit a poor amplitude difference parameter. More specifically, the operation band in which this parameter is acceptable (between −0.5 and 0.5 dB) is very narrow.

U.S. Pat. No. 6,052,039 describes a balun with localized components formed of several π and T filters of LCL or CLC type between the common-mode access and each differential mode access, to widen the balun passband. The forming of such a balun in the form of localized elements is particularly bulky due to the number of π and T filters and, especially, takes much more space than a balun of the type shown in FIG. 1.

U.S. Pat. No. 5,148,130 also describes a wide-band balun with localized elements, formed by means of several π structures of LCL or CLC type between the common-mode access and the differential mode accesses.

In the two above documents, it is desired to widen the frequency band of the balun by multiplying the number of filtering cells. Typically, the bandwidths desired by these baluns are of several hundreds of megahertz.

SUMMARY OF THE INVENTION

The present invention aims at improving narrow-band (under 100 MHz) mode-switching transformers with localized components and especially the amplitude difference parameter.

The present invention also aims at providing such a mode-switching transformer that can be integrated without taking more space than a conventional narrow-band transformer of the type shown in FIG. 1.

To achieve all or part of these objects, as well as others, the present invention provides a mode-switching transformer with localized components comprising:

between a first common-mode access terminal and a first differential-mode access terminal defining a first path, two LC cells, each formed of an inductance interposed on the first path and of a capacitor connecting one end of this inductance to ground; and between said first common-mode access terminal and a second differential-mode access terminal defining a second path, two LC cells, each formed of a capacitor interposed on the second path and of an inductance connecting one of the electrodes of this capacitor to ground, the respective inductances of the two cells of each path being made in the form of inductances with a midpoint having respective coupled portions of a same path formed in several superposed metallization levels.

According to an embodiment of the present invention, the central frequencies of a same path are selected to surround the central frequency of the operating band desired for the complete transformer.

The foregoing objects, features, and advantages of the present invention will be discussed in detail in the following non-limiting description of specific embodiments in connection with the accompanying drawings.

BRIEF DESCRIPTION OF THE DRAWINGS

FIGS. 4A and 4B show, respectively as seen from above and in exploded perspective view, an example of the forming of an inductance with a midpoint used in a balun according to the present invention.

DETAILED DESCRIPTION

Figure 1:
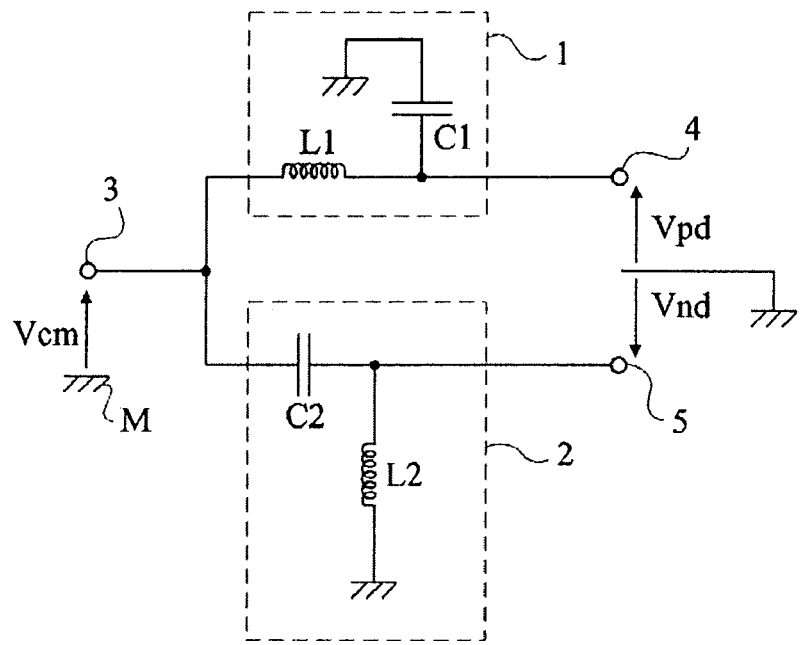
FIG. 1, previously described, shows a conventional example of a narrow-band mode-switching transformer with localized components.

Same elements have been referred to with same reference numerals in the different drawings. For clarity, only those elements which are necessary to the understanding of the present invention have been shown in the drawings and will be described hereafter. In particular, the circuits for supplying the differential mode D.C. components have not been illustrated and are no object of the present invention. Similarly, the circuits connected on the common-mode side (generally, an antenna) and on the differential mode side have not been shown, the present invention applying whatever the destination of the mode-switching transformer, provided for this application to be compatible with its operating frequencies.

According to an embodiment of the present invention, two LC cells of identical structure and of a structure different from that of the LC cells of the other path are provided on each path separating the common-mode access to one of the differential mode accesses.

Another feature of a preferred embodiment of the present invention is to form the four inductances of the mode-switching transformer in the form of two inductances with a midpoint having their respective portions stacked two-by-two.

Another feature of a preferred embodiment of the present invention is that the LC cells of each path are sized so that their respective central frequencies are located on either side of the central frequency desired for the complete mode-switching transformer.

Conversely to the known wide-band transformers of documents U.S. Pat. Nos. 5,148,130 and 6,052,039, the cells provided by the present invention are LC cells exclusively, and not π or T structures of LCL or CLC type.

Against all expectations, the fact of providing, on each path, two LC cells in series related to filtering cells of a same type but of a different type from the filtering cells of the other path, is compatible with the obtaining of a narrow-band mode-switching transformer. It used to be believed up to now, and especially in previously-mentioned U.S. Pat. Nos. 5,148,130 and 6,052,039, that associating several cells of the same type in series would necessarily result in a wide-band transformer.

Another difficulty is to respect the 180° phase difference between the paths. Indeed, if two respectively high-pass and low-pass filters of the first order placed on the respective transformer paths result in respective +90° and −90° phase shifts (FIG. 1), the fact of passing on to second order filters would result in respective phase shifts of +180° and −180°, thus resulting in a zero phase shift between the differential paths, and thus in the loss of the balun effect.

According to an embodiment of the present invention, the phase difference between the two paths and the narrow-band character of the balun are both preserved by shifting the respective frequencies of each cell of a same path with respect to the central frequency, so that these frequencies surround it and that the sum of the two phase shifts at the central frequency and in the entire band desired for the transformer is 180° between the paths.

Figure 2:
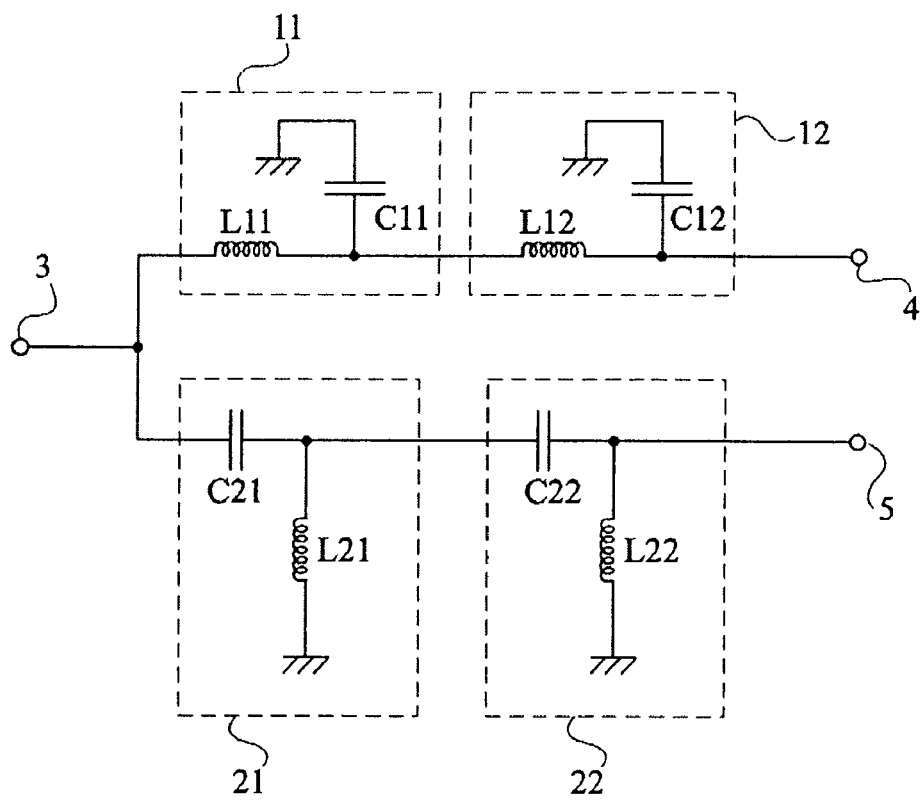
FIG. 2 shows the electric diagram of an embodiment of a mode-switching transformer according to the present invention.

FIG. 2 shows the electric diagram of a mode-switching transformer according to an embodiment of the present invention.

It shows, as in a conventional mode-switching transformer with localized components, a common-mode access terminal 3 and two differential mode access terminals 4 and 5.

On a first path (between terminals 3 and 4), two LC cells 11 and 12 of the same type (implementing two low-pass filter orders) are provided. Cell 11 comprises an inductance L11 and a capacitor C11. Cell 12 comprises an inductance L12 and a capacitor C12. Inductances L11 and L12 are thus in series between terminals 3 and 4, capacitor C11 grounds their junction point, and capacitor C12 grounds terminal 4.

On the side of the second path (between terminals 3 and 5), two cells 21 and 22 of a type opposite to that of the cells of the first path are provided. These two cells here implement high-pass filter orders. Cell 21 comprises a capacitor C21 and an inductance L21. Cell 22 comprises a capacitor C22 and an inductance L22. Capacitors C21 and C22 are thus in series between terminals 3 and 5. Inductance L21 grounds their junction point and inductance L22 grounds terminal 5.

As in a conventional mode-switching transformer, additional circuits bringing D.C. components (bias voltage) on the differential mode side may be provided. However, cell 22, although comprising an inductance and a capacitor in an arrangement close to that of a bias circuit (shock inductance connected to a bias voltage and D.C.-to-common mode blocking capacitor), differs from it by the fact that no D.C. bias voltage is applied to inductance L22 and by the strongly different values of the components. For a given central frequency, the value of the capacitor of a bias circuit is on the order of ten times as high as that of capacitor C22 and its inductance is at least three times as high as inductance L22.

Preferably, to size the inductance capacitors, it is started from values obtained by using the following conditions and formulas, and these values are optimized by using, for example, real models based on conventional simulation tools.

It is started from identical values of inductances L11 and L12 and from identical values of inductances L21 and L22, respectively. Similarly, it is started from identical values of capacitors C12 and C11 and from identical values of capacitors C21 and C22, respectively. Values L and C of the identical components are calculated for each path by using the following formulas:

$$L = \frac{\sqrt{Z1Z2}}{\omega} \text{ and } C = \frac{1}{\omega\sqrt{Z1Z2}},$$

where ω represents the pulse at the central frequency of the desired operating band, where Z1 designates the common-mode access impedance and where Z2 represents the impedance of the differential output.

The determination of the values to be given to the components of a mode-switching transformer with localized components according to the present invention is within the abilities of those skilled in the art based on the functional indications and on the conditions given hereabove, these values being of course to be adapted, for example, by means of current simulation tools, according to the manufacturing process and other parameters (materials, etc.) which conventionally condition the operation of a balun with respect to an ideal case.

As a specific example of implementation, the present inventors have made a mode-switching transformer with the following approximate values:

L11=10.2 nanohenries;
L12=12.4 nanohenries;
L21=18.3 nanohenries;
L22=22.6 nanohenries;
C11=2.1 picofarads;
C12=1.0 picofarads;
C21=5.6 picofarads; and
C22=2.7 picofarads.

With such values, the respective cut-off frequencies of the cells are the following:

cell 11: 0.95 GHz;
cell 12: 1.4 GHz;
cell 21: 0.5 GHz;
cell 22: 0.65 GHz.

The obtained mode-switching transformer exhibits, for an operating frequency band between 820 and 920 MHz and a central frequency on the order of 870 GHz, the following parameters:

amplitude imbalance ranging between −0.5 and 0.5 dB;
insertion loss smaller than 0.74 dB;
phase imbalance ranging between −2.3° and 0.78°; and
matching smaller than −15.8 dB.

These parameters are given while taking into account a 10% tolerance for capacitors and a 5% tolerance for inductances.

Such parameters should be compared with the following parameters, which would be obtained with a conventional structure of the type shown in FIG. 1:

amplitude imbalance ranging between −2 and 2 dB;
insertion loss smaller than 0.71;
phase imbalance ranging between −220 and 1.1°; and
matching smaller than −14 dB.

An advantage of the present invention thus is to considerably improve the amplitude imbalance with respect to a conventional structure, without adversely affecting the other parameters.

The mode-switching transformer of FIG. 2 is obtained without requiring a more significant surface bulk than a conventional transformer (FIG. 1) by forming inductances L11 and L12, respectively L21 and L22, in the form of an inductance with a midpoint having its two portions stacked up by using three metallization levels (one for each portion on either side of the midpoint and one to transfer the midpoint to the outside of the windings).

Advantage is then taken from the structure of the transformer of FIG. 2 provided by the present invention. Indeed, since inductances L21, L22 have a grounded midpoint and inductances L11 and L12 have a midpoint connected to capacitor C11, their forming is compatible with the use of an inductance with a midpoint with stacked portions.

Such an embodiment even enables reducing the size with respect to a conventional mode-switching transformer. Indeed, due to the coupling obtained between the two portions of each inductance with a midpoint, the inductance value is multiplied by four for a given length and an identical number of spirals. For a given inductance value, the length of the conductive track and/or the number of spirals is thus reduced. The actual forming of an inductance with a midpoint in three conductive levels is known. Reference can be made, for example, to U.S. patent application 2003/0210122 of the applicant.

Figure 3:
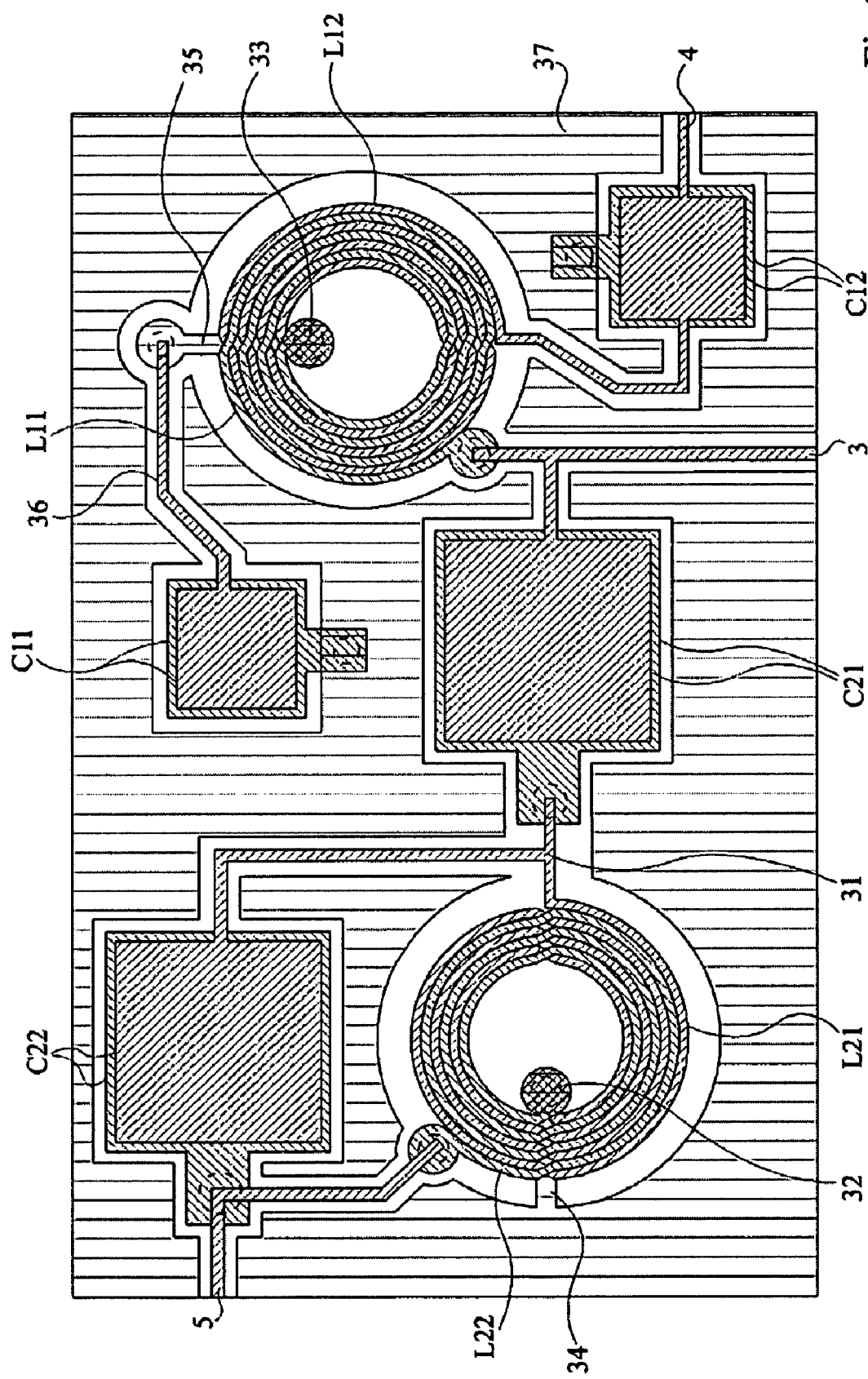
FIG. 3 is a simplified top view of an example of the forming of the balun of FIG. 2 in integrated form.

FIG. 3 is a simplified top view of a mode-switching transformer with inductances with a midpoint according to an embodiment of the present invention.

This drawing is a top view of a forming in three metallization levels separated from one another by insulating levels (non-ferromagnetic). For simplification, the insulating levels have not been shown.

Inductances L11 and L12 are formed by a structure with a midpoint of the type of those described in previously-mentioned US patent application 2003/0210122. Inductances L21 and L22 are also formed in a structure of an inductance with a midpoint of this type. Capacitors C11, C12, C13, and C22 are, preferably, formed by using the same metallization levels as those in which are formed inductances as well as their midpoint transfer tracks, the insulating layers separating these metallization levels forming the respective dielectrics of the different capacitors.

As appears from FIG. 3, midpoints 32 and 33 of the respective stacked inductances are connected by a conductive track, respectively 34 and 35, in a third metallization level outside of the structure of the corresponding inductance, to be connected to capacitor C11 (track 36) or to ground plane 37.

Conversely to the symmetrical structure described in US application 2003/0210122, different inductance values are obtained for inductances L1, L12, L21, and L22 respectively by providing said inductances with different lengths. In other words, the ends of windings L11 and L12 respectively connected to terminals 3 and 4 are not diametrical in the first structure of an inductance with a midpoint. Similarly, the ends of inductances L21 and L22, respectively connected to midpoint 31 between capacitors C21 and C22 and to terminal 5, are not diametrical in the second structure of an inductance with a midpoint.

The rest of the structure of FIG. 3 is within the abilities of those skilled in the art for the forming of the vias (symbolized in dotted lines) between the different metallization levels and the connection tracks of the different components.

A structure such as illustrated in FIG. 3 shows, with the values of the previously-given numerical example, a surface area on the order of 1.5 mm$^2$, which should be compared with a 1.7-mm$^2$ surface area necessary to form, with values L1=11 nH, C1=2.8 pF, L2=10 nH, C2=3 pF, a conventional balun of the type shown in FIG. 1.

FIGS. 4A and 4B illustrate, respectively in a top view and in an exploded perspective view, an example of the forming of inductances with a midpoint (for example, L21 and L22) from three metallization levels M1, M2, M3 (FIG. 4B). For example, winding L21 is formed in level M3, winding L22 is formed in level M2, and track 34 transferring the contact of midpoint 32 to the outside is formed in level M1. For simplification, the insulating levels separating the conductive levels have not been shown and windings L21 and L22 have been assumed to be of same length. The order of the levels may be different. For example, track 34 may be formed in intermediary level M2 between levels M1 and M3 then comprising windings L21 and L22 (or conversely).

Of course, the present invention is likely to have various alterations, modifications, and improvements which will readily occur to those skilled in the art. In particular, the respective sizing of the inductances and capacitors of the balun of the present invention depends on the application and especially on the frequency of the selected bandwidth and is within the abilities of those skilled in the art based on the indications given hereabove and on conventional modeling tools.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A mode-switching transformer with localized components, comprising:
a first current path between a first common-mode access terminal and a first differential-mode access terminal, a first two LC cells, each formed of an inductance interposed on the first current path and formed of a capacitor connecting one end of the inductance to ground; and
a second current path between said first common-mode access terminal and a second differential-mode access terminal, a second two LC cells, each formed of a capacitor interposed on the second current path and formed of an inductance that connects an electrode of the capacitor of the corresponding second LC cell to ground,
the respective inductances of the two cells of each of the first and second paths comprising a common path that lies in more than one superposed metallization levels and a midpoint that couples the levels to one another.

2. The transformer of claim 1, wherein central frequencies of the first and second paths are selected to surround a central frequency of a desired operating band of the mode-switching transformer.

3. A mode-switching transformer comprising:
a first path between a first common-mode access terminal and a first differential-mode access terminal that passes through a first pair of LC cells, each of the first pair of LC cells having one inductor in series with the first path and one capacitor that connects the first path to ground; and
a second path between the first common-mode access terminal and a second differential-mode access terminal that passes through a second pair of LC cells, each of the second pair of LC cells having one capacitor in series with the second path and one inductor that connects the second path to ground;
wherein at least one of the inductors of the first pair of cells or the second pair of cells comprises a common conductive path that lies in more than one superposed metallization levels and a midpoint that couples the levels to one another.

4. The transformer of claim 3, having a central operating frequency, wherein central frequencies of each of the first and second paths are configured to surround the central operating frequency of the transformer.

5. The transformer of claim 3, wherein the inductors of each of the first pair of cells comprise a common conductive path that lies in more than one superposed metallization levels and a midpoint that couples the levels to one another.

6. The transformer of claim 5, wherein the inductors of each of the second pair of cells comprise a common conductive path that lies in more than one superposed metallization levels and a midpoint that couples the levels to one another.

* * * * *